United States Patent
Noeske et al.

(10) Patent No.: US 6,351,631 B1
(45) Date of Patent: Feb. 26, 2002

(54) CARRIER GENERATIONS FACILITY FOR A DIGITAL MPX-SIGNAL DEMODULATION MICRONAS INTERMETALL GMBH

(75) Inventors: Carsten Noeske, Freiburg; Martin Winterer, Gundelfingen, both of (DE)

(73) Assignee: Micronas Intermetall GmbH (DE)

( * ) Notice: Subject to any disclaimer, the term of this patent is extended or adjusted under 35 U.S.C. 154(b) by 0 days.

(21) Appl. No.: 09/249,524

(22) Filed: Feb. 12, 1999

(30) Foreign Application Priority Data

Feb. 12, 1998 (EP) ............................................. 98102418

(51) Int. Cl.$^7$ ............................. G08C 25/04; H04L 1/04
(52) U.S. Cl. ........................................ 455/260; 375/326
(58) Field of Search .................................. 375/326, 364, 375/376; 370/363, 364; 381/1, 2, 3, 4, 15, 67, 14, 10; 455/260

(56) References Cited

U.S. PATENT DOCUMENTS

| | | | |
|---|---|---|---|
| 5,023,609 A | | 6/1991 | Reich |
| 5,357,544 A | | 10/1994 | Horner et al. |
| 5,432,855 A | * | 7/1995 | Koo et al. ................... 381/12 |
| 5,440,586 A | * | 8/1995 | Braber ........................ 375/327 |
| 5,467,399 A | | 11/1995 | Whitecar |
| 5,507,024 A | * | 4/1996 | Richards, Jr. ............... 455/260 |
| 5,592,557 A | * | 1/1997 | Chahabadi et al. .......... 380/10 |
| 6,018,556 A | * | 1/2000 | Janesch et al. .............. 375/376 |

FOREIGN PATENT DOCUMENTS

EP 0305974 3/1989

OTHER PUBLICATIONS

Raz, et al., A Digital Signal Processing Approach To Multichannel Television Sound Decoding, "IEEE Transactions on Consumer Electronics", Bd. 32, No. 3, Aug. 1986.
Copy of European Search Report for EP98 10 2418, dated Aug. 4, 1998.

* cited by examiner

*Primary Examiner*—Chi Pham
*Assistant Examiner*—Dung X. Nguyen
(74) *Attorney, Agent, or Firm*—Duane Morris; Arthur L. Plevy

(57) ABSTRACT

Carrier generation facility for a switchable digital demodulator (D) of digital MPX signals (mpx1) with associated pilot signal (p1) which are locked to an arbitrary clock signal (t1). A pilot signal PLL (10) generates a first carrier signal (x1.1, x2.1) and a second carrier signal (x1.2) by means of a first value allocator (15) and a second value allocator (20), respectively. According to the MPX signal (mpx1) to be demodulated, a control device (60) delivers a start value (i0) and at least one phase correction value (k1, k2). The start value (i0) sets the capture range of the pilot signal PLL (10) for the pilot signal (p1) according to the respective standard. In a first correcting device (16) and/or a second correcting device (23), the phase correction values (k1, k2) correct the system-inherent phase deviations of the first carrier signal (x1.1, x2.1) and/or the second carrier signal (x1.2).

20 Claims, 3 Drawing Sheets

US 6,351,631 B1

CARRIER GENERATIONS FACILITY FOR A DIGITAL MPX-SIGNAL DEMODULATION MICRONAS INTERMETALL GMBH

FIELD OF INVENTION

The present invention relates to MPX signals, and more particularly to a carrier generation facility for a demodulator thereof.

BACKGROUND OF INVENTION

MPX signals are used in the transmission of frequency-modulated stereo broadcast signal in the VHF range or in the transmission of television sound according to the BTSC standard for example. Besides the sound information, the MPX signal may contain additional information, such as the Automotive Radio Information ("ARI") and/or Radio Data System ("RDS") information. The frequency schemes of the various MPX standards differ only slightly. Generally they contain, at baseband, a sum signal R+L, a pilot signal above the sum signal, and a suppressed-carrier amplitude-modulated difference signal L–R at twice the pilot frequency. Above the difference signal, there may be additional signals, particularly around three times the pilot frequency. The contents of the individual types of additional information are inserted in the MPX signal by single-sideband modulation or, particularly in the case of digital information, by quadrature modulation, for example.

A distinction between the individual MPX standards is possible via the frequency of the respective pilot signal, which is 15.734 kHz in the case of television signals according to the BTSC television standard and 19 kHz in the case of FM radio. For the demodulation of the individual signal components, which is done by mixing, carrier signals of correct frequency and phase must be provided in the demodulator, with the respective pilot signal serving as a reference signal. For digital demodulation, digital carrier signals are used whose values at the sampling instants correspond to the values of analog carrier signals. An example of a digital modulator can be found in a data sheet of ITT Semiconductors entitled "CAP 3540B, CAP 3541B—Car Audio Processor Hardware", Edition May 22, 1997, Order No. 6251-434-1PD. The processing clock frequency in the monolithic integrated circuit of that demodulator is locked to the frequency of the pilot signal.

It is an object of the invention to provide a digital demodulator which processes different MPX standards with minimal additional circuitry, with the clock rate of the digital carrier signal, and thus the clock rate in the digital demodulator, being independent of the frequency of the pilot signal such that arbitrary clock systems may be used.

SUMMARY OF INVENTION

Carrier generation facility for a switchable digital demodulator (D) of digital MPX signals (mpx1) with associated pilot signal (pi) which are locked to an arbitrary clock signal (t1). A pilot signal PLL (10) generates a first carrier signal (x1.1, x2.1) and a second carrier signal (x1.2) by means of a first value allocator (15) and a second value allocator (20), respectively. According to the MPX signal (mpx1) to be demodulated, a control device (60) delivers a start value (i0) and at least one phase correction value (k1, k2). The start value (i0) sets the capture range of the pilot signal PLL (10) for the pilot signal (p1) according to the respective standard. In a first correcting device (16) and/or a second correcting device (23), the phase correction values (k1, k2) correct the system-inherent phase deviations of the first carrier signal (x1.1, x2.1) and/or the second carrier signal (x1.2).

DETAILED DESCRIPTION OF INVENTION

The object is attained by electronically switching the capture range of a single pilot signal PLL according to the MPX standard to be received and by performing a system-related phase correction in the carrier generation facility, which is coupled to the pilot signal PLL.

The instant invention and preferred embodiments thereof will now be explained in greater detail with reference to the accompanying drawings, in which common references refer to common elements of the invention.

Figure 1:
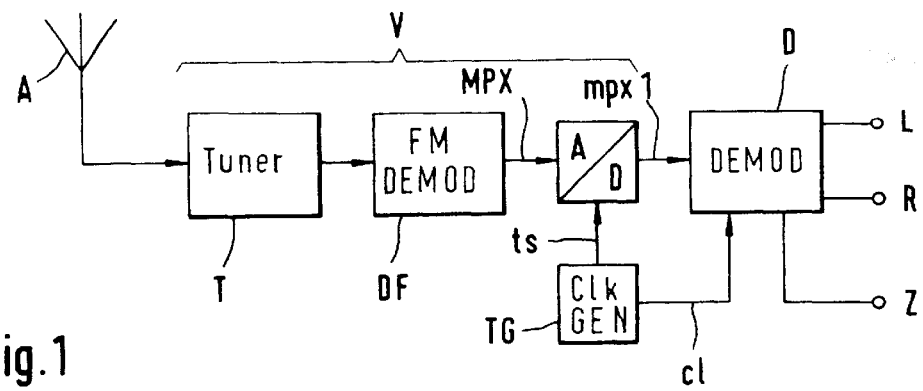
FIG. 1 shows the main stages of an MPX signal receiver.

FIG. 1 illustrates typical functional units of a digital MPX-signal receiver. A digital demodulator D receives a digitized MPX signal mpxl from a front end V, with the data rate corresponding to a clock rate t1. The circuits connected to the digital demodulator D for effecting left/right signal separation, tone control, and gain control are not shown.

The front end V can be part of a radio or television receiver. The radio or television channel is received by means of an antenna A and fed to a tuner T, which converts it to an intermediate frequency. The frequency-modulated intermediate-frequency signal is demodulated by means of an FM demodulator DF, and the MPX signal MPX is thus at baseband. An analog-to-digital converter AD controlled by a digitization clock ts delivers the digital MPX signal mpxl, which is processed as described in detail with reference to FIGS. 2 and 4. Alternatively, use can be made of a digital FM demodulator, which is supplied with an intermediate-frequency signal that has already been digitized. The clock rate ti of the digitized MPX signal mpxl is, as a general rule, identical with the pulse repetition rate of the digitization clock ts, which also serves as, or is locked to, the system clock cl in the digital demodulator D. The clock generation is shown schematically by a clock generator TG.

Figure 2:
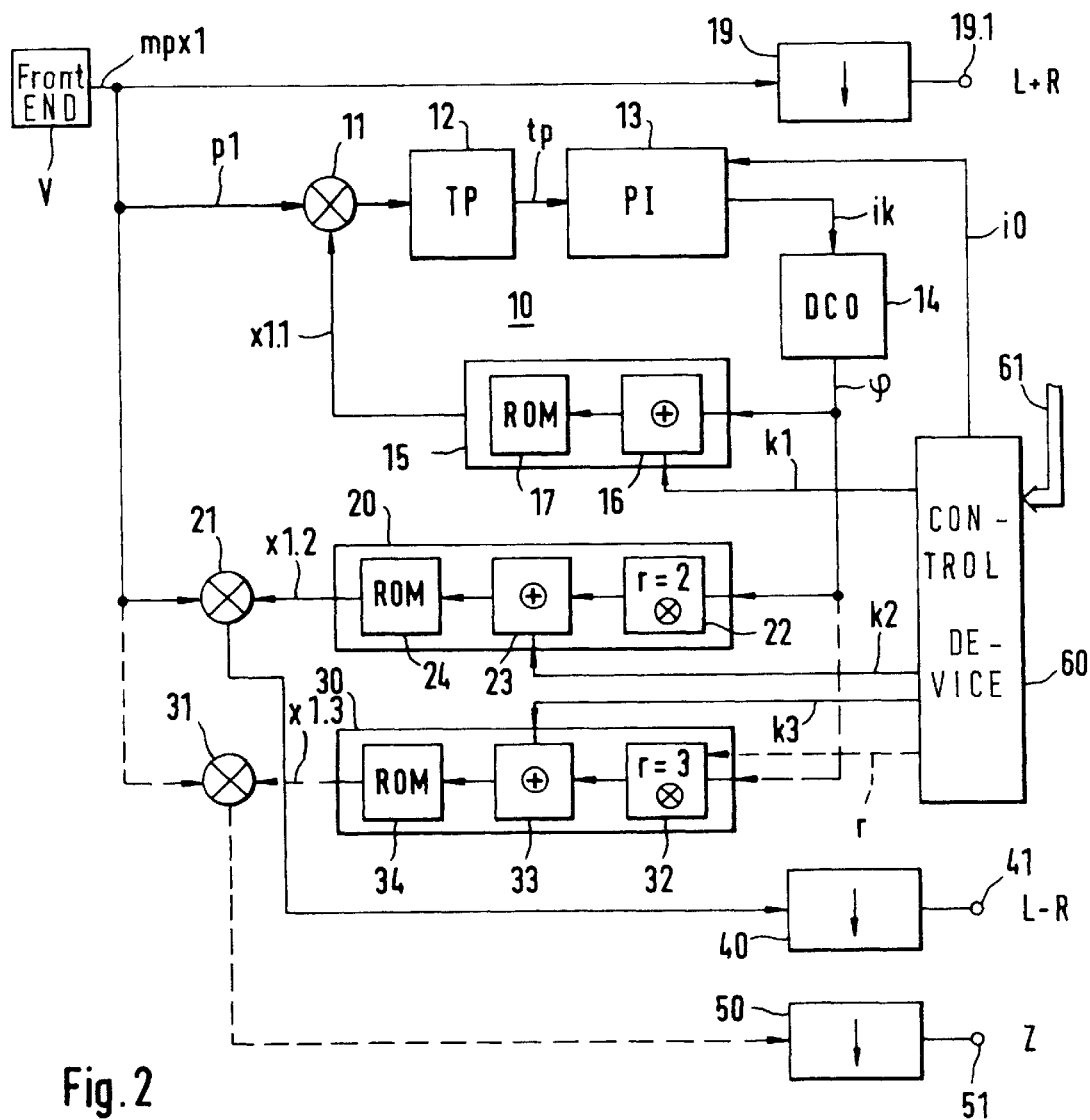
FIG. 2 is a block diagram of a first embodiment of the the invention.

The embodiment of FIG. 2 shows a carrier generation facility according to the invention for the digitized MPX signal mpxl. The MPX signal mpxl delivered by the front end V at the clock rate tl contains a pilot signal p1, which is filtered out by means of a pilot signal PLL 10. A mixer 11 fed by the MPX signal mpx1 forms the input of the pilot signal PLL 10. The output of the mixer is filtered by means of a low-pass filter 12 and fed to a controller 13, which can have a linear, nonlinear, or mixed control characteristic. Already a simple PI controller with the transfer function $$K(z) = k_p + k_i/(1+z^{-1}) \qquad (1)$$

proves to be advantageous. The coefficient $k_p$ determines the proportional component, and the coefficient $k_i$ the integral component. The output value of the controller 13 serves as an increment ik for a digitally controlled oscillator 14, which is designed as an overflowing accumulator. The respective output value corresponds to a phase value φ which forms, via an angle table 17 in a first value allocator 15, the sine or cosine values of the first carrier signal x1.1, which is fed to the second input of the mixer 11.

To correct the phase values φ, the value allocator 15 includes a correcting device 16 in which a constant correction value k1 from a control device 60 is added to or subtracted from the respective phase value φ using modulo arithmetic. The correction value k1 is used to correct system-inherent phase deviations in the pilot signal PLL 10 which are caused, for example, by the orthogonality of the carrier signal x1.1 to the pilot signal p1, by decimation circuits, or by delay elements. Different pilot signal frequencies require different correction values k1. Through the correction, the output value φ of the digitally controlled oscillator 14 has a precisely defined phase relationship to the respective pilot signal p1 without offset.

With the reference phase of the pilot signal p1, which is now known, the second carrier signal x1.2 for the difference signal L–R and the third carrier signal x1.3 for at least one additional signal Z can be formed. The sum signal L+R is filtered directly out of the MPX signal mpx1 by means of a first decimator 19 with an associated low-pass filter, and can be picked off at a terminal 19.1.

The second carrier signal x1.2 for converting the difference signal L–R in a second mixer 21 is formed in a second value allocator 20, which contains a frequency multiplier 22 with a modulo stage, which is fed the phase value φ, an optional second correcting device 23, and an angle table 24. The frequency multiplier 22 multiplies the phase value φ by the frequency multiplication value r=2, with the modulo stage holding the previous range of values, which corresponds to $2\pi$. The second correcting device 23 can be dispensed with if the correction took place already in the pilot signal PLL 10 and no further phase error has to be corrected. The order of the frequency multiplication and the correction is interchangeable, but then requires a modified correction value, since this value will be multiplied by the frequency multiplication value r. The output of the second mixer 21 contains the difference signal L–R at baseband, which is filtered out by means of a second decimator 40 with an associated low-pass filter; for this, the output clock frequency $t_{out}$ can be further reduced. Since the difference signal L–R provided at an output 41 is combined in a matrix (not shown) with the sum signal L+R, the decimator 19 and the decimator 40 must have identical filter characteristics.

If the MPX signal mpx1 contains one or more additional signals, the associated carrier frequency is, as a rule, locked to the pilot signal p1. The additional signal(s) is (are) recovered by means of a third value allocator (30), which forms a third carrier signal x1.3 for a third mixer 31. The input stage of the third value allocator is a frequency multiplier 32 with a modulo stage. If, for example, the additional information is locked to three times the pilot signal frequency, the frequency multiplication value r is 3. If the frequency multiplication value r is preset for the respective MPX standard by the control device 60, arbitrary additional information Z can be selected. Corresponding programming of the control device 60 is effected via a bus 61, for example. The third value allocator 30 further includes an optional phase-correcting device 33 and a value table 34, with which the respective sine or cosine values are allocated to the phase value φ. The angle tables 17, 24, 34 for the three value allocators 15, 20, 30 are preferably implemented as respective read-only memories (ROMs) The output of the third mixer 31 is the additional signal Z at baseband, which is filtered but by means of a third decimator 50 with an associated low-pass filter and is available at a terminal 51.

The additional information Z at the third pilot signal frequency contains different information with respect to the phase of the orthogonally modulated carrier, namely the ARI identification and/or the digital RDS signal. By means of the third correcting device 33 or by switching from sine values to cosine values in the third angle table 34, the additional information Z is translated to baseband with the corresponding phase. In the simplest case, this switching is effected via the third correction signal k3 from the control device 60.

The description of the embodiment of FIG. 2 shows that the desired switching from television sound to radio sound is accomplished by simple control signals from the control device 60.

Figure 3:
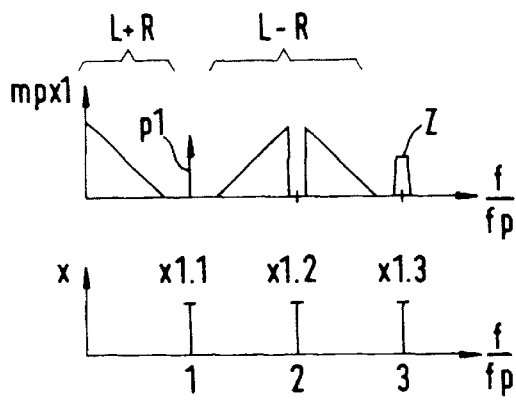
FIG. 3 shows an MPX frequency and carrier scheme for the embodiment of FIG. 2.

FIG. 3 shows the frequency scheme of the MPX signal mpx1, which is sampled with a clock signal t1 whose frequency may lie in a wide frequency range between 100 kHz and up to a few MHZ. The pilot signal p1, shown as a line, defines the frequency and phase for the carrier of the difference signal L–R and for the carrier of the additional signal(s) Z. The associated carrier scheme x in the digital demodulator D, which is assigned to the clock rate t1, is shown below the frequency scheme and contains the first carrier x1.1 for the pilot signal, the second carrier x1.2 for the difference signal L–R, and the third carrier x1.3 for the additional signal Z.

The embodiment of FIG. 2 generates the carrier signals x at the clock rate t1. Since the pilot signal PLL 10 needs to lock only onto the 15-kHz or 19-kHz pilot signal pl, a reduction of the processing clock frequency in this portion of the circuit is appropriate. However, the use of decimators with associated filters causes a further delay of the signals to be processed in the pilot signal PLL. In view of the exact phase relationship required for the carrier signals, this delay is not negligible. By the predetermined correction values k1, k2, k3, system-inherent group delays can be covered in addition to the clock-induced delays.

Figure 4:
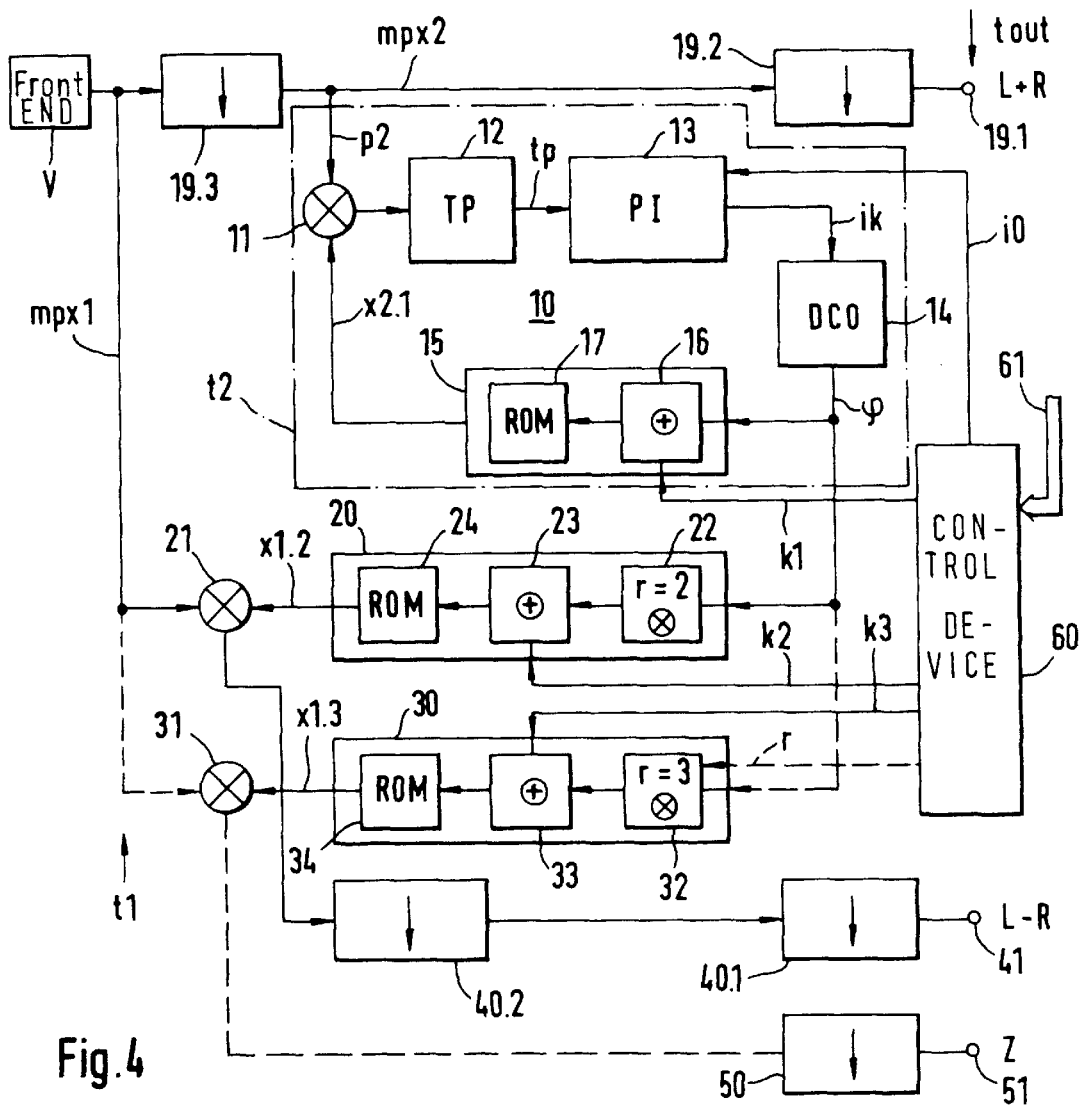
FIG. 4 is a block diagram of a second embodiment.

FIG. 4 shows an embodiment of the invention in which the carrier generation facility makes use of decimators to the greatest possible extent. The great similarity between the circuits of FIGS. 2 and 4 is readily apparent. Since like functional units are designated by like reference characters, a repetition of the basic description is not necessary.

The embodiment of FIG. 4 shows the front end V, which again provides the digital MPX signal mpx1 at the clock frequency t1. For the signal processing in the pilot signal PLL 10, the clock rate, as mentioned, can be considerably reduced. A first decimator 19.3 reduces the clock rate t1 of the MPX signal mpx1 to a lower clock rate t2 and forms a decimated MPX signal mpx2. That portion in the carrier generation facility which runs at the low clock rate t2 is bordered in FIG. 4 by a dash-and-dot line. The reduction of the clock rate has no effect on the frequency of the digitally controlled oscillator 14 and the phase value φ except for the coarser time pattern. Nevertheless, it is not readily possible to form the second and third carrier signals x1.2, x1.3 from the phase value φ, because the phase value p is related to the output of the decimator 19.3, while the first and second carrier signals x1.2, x1.3 are related to the input of the decimator 19.3. The signal delay in the circuit of the decimator 19.3 and the group delay of the filter of this decimator result in an additional phase deviation. However, this additional phase deviation can also be compensated for by means of the first correction value k1, so that the phase value φ relates to the MPX signal mpx1 with the clock rate t1 again.

The clock rate $t_{out}$ of the sum signal L+R at the output 19.1 is obtained by decimating and filtering the MPX signal mpx2 in the decimator 19.2. The two decimators 19.3 and 19.2 together correspond to the decimator 19 of FIG. 2.

The second and third value allocators 20, 30 of FIG. 4 are identical to the corresponding value allocators of FIG. 2. The same applies to the second and third correction values k1, k2, since the phase value φ is related by the first correction value k1 to the MPX signal mpx1 ahead of the decimator 19.3. In order that the difference signal L−R at the output 41, which is assigned to the output clock $t_{out}$, has the same phase relation as the sum signal L+R, the associated decimation facility 40.1, 40.2 must have the same characteristics as the two decimators 19.3, 19.2 for the sum signal. The output of the second mixer 21 is therefore fed to two series-connected decimators 40.2, 40.1, which are identical to the corresponding decimators 19.3, 19.2 for the sum signal L+R. The decimator 50 for the additional signal Z at the output 51 can be independent of the other decimators, because the additional signal Z is processed separately. Since the signal content of the latter covers only a very small frequency range, the decimation factor of the decimator 50 can be higher than that of the other decimators.

The reduction of the clock rate reduces the circuit complexity of the filter devices. Additionally, however, the lower clock rate makes it possible for individual functional units to operate in a multiplex mode or permits at least partial functions to be performed by suitably programmed processors which, as a result of their high processing speed, compute the individual partial functions sequentially in the background, because the low clock speed makes sufficient computing time available for this purpose.

Figure 5:
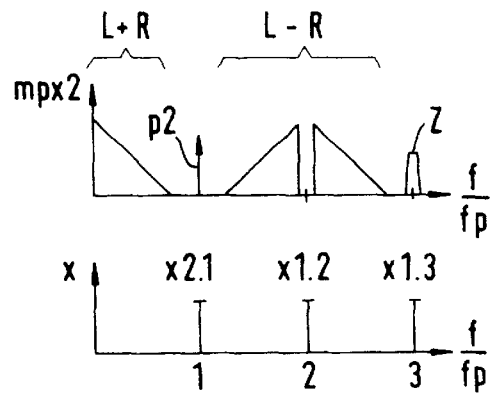
FIG. 5 shows an MPX frequency and carrier scheme for the embodiment of FIG. 4.

FIG. 5 shows the frequency scheme of the decimated MPX signal mpx2, whose clock rate is determined by the second clock t2, but in which the frequency positions of the individual signal ranges are identical to those of the MPX signal mpx1. The associated carrier scheme x in the digital demodulator D differs from that of FIG. 3 in that the first carrier x2.1 is assigned to the low clock rate t2. The two other carriers x1.2, x1.3 are assigned to the high first clock rate t1.

Figure 6:
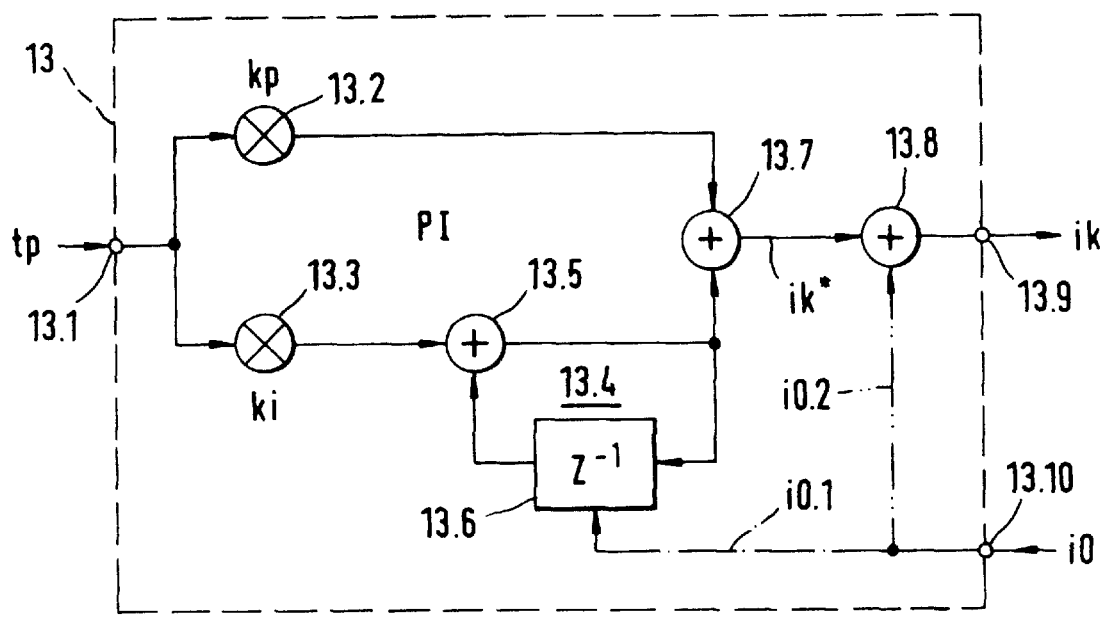
FIG. 6 is a block diagram of a PI controller in the pilot signal PLL.

FIG. 6 shows the controller 13 as a PI controller in some more detail. The output values tp of the pilot signal low-pass filter 12 are fed to an input terminal 13.1. The processing then splits into a proportional branch, containing a multiplier 13.2, and an integral branch, containing a multiplier 13.3 and an accumulator 13.4. The two branches are combined via an adder 13.7 and form at an output 13.9 an increment value ik for controlling the digitally controlled oscillator 14. By means of the coefficients $k_p$ and $k_i$, the respective proportional and integral components in the PI controller 13 are determined. The start value i0 applied at a terminal 13.10 either predefines the start contents i0.1 of the accumulator 13.4 or is added as a start value i0.2 to the output value ik* of the adder 13.7 by means of a second adder 13.8. The accumulator 13.4 consists as usual of an adder 13.5 and a storage device 13.6.

By the predefinition of the start value i0 in the controller 13, the increment value ik at the output 13.9 is brought near its desired value, so that the pilot signal PLL 10 will reliably lock onto the existing pilot signal p1, p2 and not onto another signal.

To ensure that the digital demodulator D also processes MPX signals mpx1, mpx2 which contain a mono signal but no pilot signal and no difference signal, a pilot signal detector should be provided. It turns off the stereo signal processing in the digital demodulator D when no pilot signal is present. In this manner, the pilot signal PLL 10 is prevented from locking onto random signals or even noise.

Figure 7:
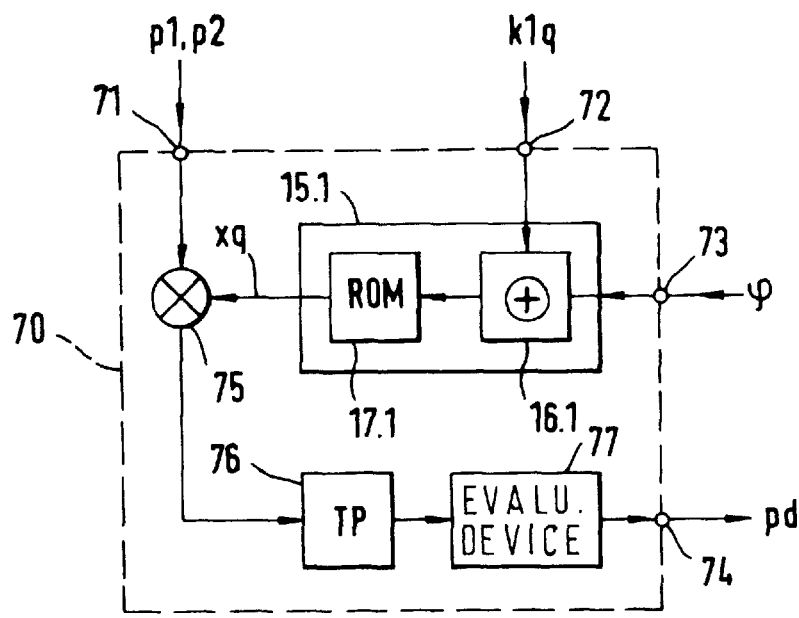
FIG. 7 is a block diagram of an advantageous pilot signal detector.

FIG. 7 shows an embodiment of a pilot signal detector 70 which can be combined to advantage with the carrier generation facility of FIG. 2 or FIG. 4. The respective MPX signal mpx1, mpx2 with the associated pilot signal p1, p2 is applied at an input 71, a correction value klq is applied at an input 72, and the phase value φ at an input 73. An output 74 provides the desired pilot detector signal pd. The pilot signal detector 70 comprises a value allocator 15.1, which is identical to the first value allocator 15 in the pilot signal PLL 10 and, like this first value allocator, contains a correcting device 16.1 and an angle table 17.1. The output of the value allocator 15.1 provides a carrier signal xq which is shifted in phase by +/−90 degrees with respect to the first carrier signal x1.1, x2.1. This carrier signal xq is fed to one input of a mixer 75, whose other input receives the respective MPX signal mpx1, mpx2. The correct phase of the carrier signal xq is set by means of the correction signal klq applied to the correcting device 16.1. The correction value klq is added to or subtracted from the respective phase value φ using modulo arithmetic.

Thus, in the presence of a pilot signal p1, p2, the mixer 75 multiplies signals of the same frequency and phase, namely the pilot signal p1, p2 by the carrier signal xq. When the pilot signal p1, p2 is present, the output of the mixer 75 provides a positive average value which is filtered out by means of a low-pass filter 76 and then fed to an evaluating device 77, which contains a threshold detector, for example. The output signal of the evaluating device 77 is the desired pilot detector signal pd. The threshold decision in the evaluating circuit 77 can be replaced by a weighting operation if more complex decision criteria are used in the formation of the pilot detector signal pd.

Although the invention has been described in a preferred form with a certain degree of particularity, it is understood that the present disclosure of the preferred form has been made only by way of example, and that numerous changes in the details of construction and combination and arrangement of parts may be made without departing from the spirit and scope of the invention as hereinafter claimed. It is intended that the patent shall cover by suitable expression in the appended claims, whatever features of patentable novelty exist in the invention disclosed.

I claim:

1. A carrier generation facility for a digital demodulator (D) of digital MPX signals (mpx1) with associated pilot signal (pl) which are provided by a front end (V), are locked to an arbitrary clock signal (t1), and may be assigned to different standards, said carrier generation facility comprising:

a pilot signal PLL (10) which is in lock with the respective pilot signal (p1) and in which a first value allocator (15) generates a first carrier signal (x1.1), which is associated with the pilot signal (p1);

a second value allocator (20), coupled to the pilot signal PLL (10) and generating a second carrier signal (x1.2), which has twice the frequency of the first carrier signal (x1.1); and, a control device (60) which, according to the standard of the MPX signal (mpx1), provides a start value (i0) and a first correction value (k1) and/or a second correction value (k2), with the start value (i0) adjusting the capture range of the pilot signal PLL (10) for the pilot signal (p1), and the first and/or second correction values (k1, k2) correcting, in a first correcting device (16) and/or a second correcting device (23), the system-inherent phase deviation of the first and/or second carrier signals (x1.1, x1.2).

2. A carrier generation facility for a digital demodulator (D) of digital MPX signals (mpx1) with associated pilot signal (p1) which are provided by a front end (V), are locked to an arbitrary clock signal (t1), and may be assigned to different standards, said carrier generation facility comprising:

a decimator (19.3) for generating from the MPX signal (mpx1) a decimated MPX signal (mpx2) which contains a decimated pilot signal (p2) and whose clock rate is equal to that of a second clock signal (t2);

a pilot signal PLL (10) which is in lock with the respective decimated pilot signal (p2) and in which a first value allocator (15) generates a decimated first carrier signal (x2.1), which is associated with the decimated pilot signal (p2);

a second value allocator (20), coupled to the pilot signal PLL (10) and generating a second carrier signal (x1.2), which has twice the frequency of the decimated first carrier signal (x2.1); and, a control device (60) which, according to the standard of the MPX signal (mpx1), provides a start value (i0) and a first correction value (k1) and/or a second correction value (k2), with the start value (i0) adjusting the capture range of the pilot signal PLL (10) for the decimated pilot signal (p2), and the first and/or second correction values (k1, k2) correcting, in a first correcting device (16) and/or a second correcting device (23), the system-inherent phase deviation of the decimated first carrier signal (x2.1) and/or of the second carrier signal (x1.2).

3. The carrier generation facility of claim 1, wherein a third value allocator (30) is coupled to the pilot signal PLL (10) and generates a third carrier signal (x1.3) whose frequency is either preset to a predetermined, preferably integral, ratio to the frequency of the pilot signal (p1) by means of a frequency multiplier (32) or arbitrarily settable by means of a frequency multiplication value (r) from the control device (60).

4. The carrier generation facility of claim 3, wherein a third correcting device (33) in the third value allocator (30) corrects the system-inherent phase deviation of the third carrier signal (x1.3) and/or sets a defined phase, for which it is fed a third correction value (k3) from the control device (60).

5. The carrier generation facility of claim 1, wherein for the respective correction of the phase value ($\phi$), the first, second, and/or third correcting devices (16, 23, 33) contain an adder or subtractor using modulo arithmetic.

6. The carrier generation facility of claim 1, wherein for the generation of an increment value (ik) for a digitally controlled oscillator (14), the start value (i0) is fed to a controller (13) incorporated in the pilot signal PLL (10), and either serves there as a start content (i0.1) for an accumulator (13.4) or is added as a permanent value (i0.2) to, or subtracted as a permanent value (i0.2) from, the controller output value (ik*) to form the increment value.

7. The carrier generation facility of claim 1, wherein the carrier generation facility includes a pilot signal detector (70) comprising a multiplier (75) whose first input is presented with the MPX signal (mpx1, mpx2) and whose second input is presented with a carrier signal (xq) shifted in phase by +/−90 degrees with respect to the first carrier signal (x1.1; x2.1), said carrier signal (xq) being formed by means of a further first value allocator (15.1) and a modified first correction value (k1q), said further first value allocator (15.1) being identical to the first value allocator (15);

a low-pass filter (76) connected to the output of the multiplier (75); and, an evaluating device (77) following the low-pass filter (76) and providing a pilot detector signal (pd) at its output.

8. The carrier generation facility of claim 2, wherein a third value allocator (30) is coupled to the pilot signal PLL (10) and generates a third carrier signal (x1.3) whose frequency is either preset to a predetermined, preferably integral, ratio to the frequency of the pilot signal (p1) by means of a frequency multiplier (32) or arbitrarily settable by means of a frequency multiplication value (r) from the control device (60).

9. The carrier generation facility of claim 8, wherein a third correcting device (33) in the third value allocator (30) corrects the system-inherent phase deviation of the third carrier signal (x1.3) and/or sets a defined phase, for which it is fed a third correction value (k3) from the control device (60).

10. The carrier generation facility of claim 2, wherein for the respective correction of the phase value ($\phi$), the first, second, and/or third correcting devices (16, 23, 33) contain an adder or subtractor using modulo arithmetic.

11. The carrier generation facility of claim 2, wherein for the generation of an increment value (ik) for a digitally controlled oscillator (14), the start value (i0) is fed to a controller (13) incorporated in the pilot signal PLL (10), and either serves there as a start content (i0.1) for an accumulator (13.4) or is added as a permanent value (i0.2) to, or subtracted as a permanent value (i0.2) from, the controller output value (ik*) to form the increment value.

12. The carrier generation facility of claim 2, wherein the carrier generation facility includes a pilot signal detector (70) comprising a multiplier (75) whose first input is presented with the MPX signal (mpx1, mpx2) and whose second input is presented with a carrier signal (xq) shifted in phase by +/−90 degrees with respect to the first carrier signal (x1.1; x2.1), said carrier signal (xq) being formed by means of a further first value allocator (15.1) and a modified first correction value (k1q), said further first value allocator (15.1) being identical to the first value allocator (15);

a low-pass filter (76) connected to the output of the multiplier (75); and, an evaluating device (77) following the low-pass filter (76) and providing a pilot detector signal (pd) at its output.

13. A carrier generator for a demodulator comprising:

a first mixer including a first input, a second input and an output;

a filter coupled to said output of said first mixer;

a controller having an input coupled to said filter, and an output;

an oscillator having an input coupled to said output of said controller, and an output;

a first value allocator having an input coupled to said output of said oscillator and an output coupled to said second input of said first mixer, said first value allocator adapted to generate a first carrier signal;

a second mixer having a first input, a second input and an output;

a second value allocator having an input coupled to said output of said oscillator and an output coupled to said second input of said second mixer, said second value allocator adapted to generate a second carrier signal; and, a control device coupled to said first and second value allocators and adapted for correcting a phase deviation associated with at least said first or second carriers.

14. The carrier generator of claim 13, wherein said controller comprises a proportional-integral control loop.

15. The carrier generator of claim 13, further comprising:
a third mixer having a first input, a second input and an output; and,
a third value allocator having an input coupled to said output of said oscillator and an output coupled to said second input of said third mixer, said third value allocator adapted to generate a third carrier signal.

16. The carrier generator of claim 13, wherein each of said first and second value allocators comprise:
a correcting device for adjusting an associated phase value according to a predetermined value; and,
means for supplying the sine or cosine of said respectively associated phase value.

17. The carrier generator of claim 13, wherein said first inputs of said first and second mixers are adapted to receive a first MPX signal.

18. The carrier generator of claim 15, wherein said first inputs of said first, second and third mixers are adapted to receive a first MPX signal.

19. The carrier generator of claim 13, further comprising a decimator having an input adapted to receive a first MPX signal and an output coupled to said first input of said first mixer and adapted to provide a second MPX signal thereto, wherein said first input of said second mixer is adapted to receive said first MPX signal.

20. The carrier generator of claim 15, further comprising a decimator having an input adapted to receive a first MPX signal and an output coupled to said first input of said first mixer and adapted to provide a second MPX signal thereto, wherein said first inputs of said second and third mixers are adapted to receive said first MPX signal.

* * * * *